United States Patent [19]

Fukatsu

[11] Patent Number: 4,744,085
[45] Date of Patent: May 10, 1988

[54] DATA PROCESSING DEVICE

[75] Inventor: Tsutomu Fukatsu, Kanagawa, Japan

[73] Assignee: Canon Kabushiki Kaisha

[21] Appl. No.: 851,130

[22] Filed: Apr. 11, 1986

[30] Foreign Application Priority Data

Apr. 13, 1985 [JP] Japan .................................. 60-77574

[51] Int. Cl.⁴ ............................................ G06F 11/00
[52] U.S. Cl. .............................. 371/30; 340/347 DD; 375/27
[58] Field of Search ............ 371/30, 37; 340/347 DD; 375/26, 27, 31

[56] References Cited

U.S. PATENT DOCUMENTS

| | | | |
|---|---|---|---|
| 4,023,199 | 5/1977 | Netravali et al. | 375/31 X |
| 4,229,820 | 10/1980 | Enomoto | 375/27 |
| 4,314,105 | 2/1982 | Mozer | 375/27 |
| 4,536,741 | 8/1985 | Farah | 375/27 X |

Primary Examiner—Charles E. Atkinson
Attorney, Agent, or Firm—Toren, McGeady & Associates

[57] ABSTRACT

A device for processing a data sequence consisting of data having an m number (an integer) of quantization levels is arranged to divide the m number of levels into an n number (an integer less than m) of groups and to make the data into such data that has a fixed part consisting of a fixed number of bits indicating the divided groups and a variable part consisting of a variable number of bits indicating each data to an extent of unit quantization level within each of the groups.

14 Claims, 12 Drawing Sheets

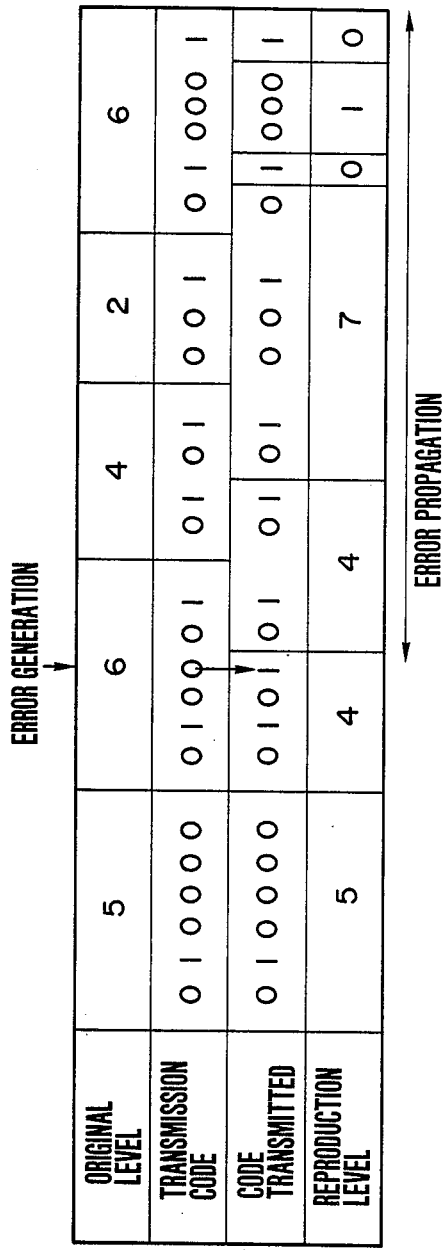

F I G. 4 (a) PRIOR ART
| LEVEL | CODE |
|-------|------|
| 0 | 0 0 |
| 1 | 0 1 |
| 2 | 1 0 |
| 3 | 1 1 |
| 4 | 0 0   0 0 |
| 5 | 0 0   0 1 |
| 6 | 0 0   1 0 |
| 7 | 0 0   1 1 |
F I G. 4 (b) PRIOR ART
| LEVEL | 1 | 7 | 4 | 2 |
|-------|---|---|---|---|
| CODE | 1 0 1 ※ | 1 0 0 0 1 1 ※   ※ | 1 0 0 0 0 0 ※   ※ | 1 1 0 ※ |
F I G. 5
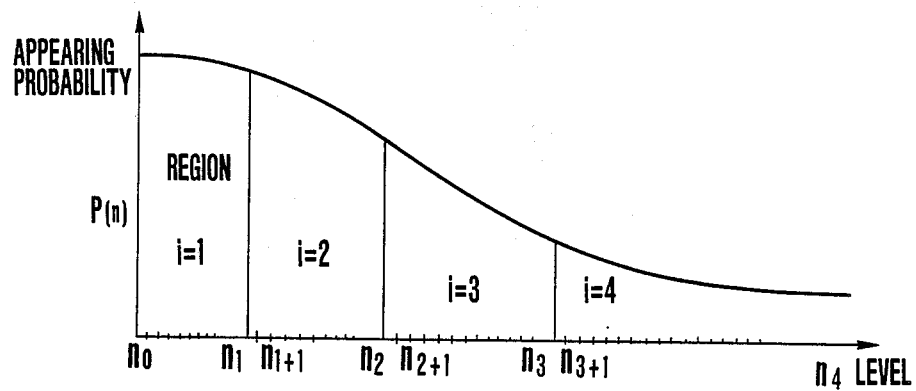

FIG.13

| INPUT DATA BLOCK | Bi-2 | Bi-1 | Bi | Bi+1 | Bi+2 |
|---|---|---|---|---|---|

FOR TRANSMISSION

| PROCESS (i) | Bi-2 | Bi-1 | Bi | Bi+1 | Bi+2 |
|---|---|---|---|---|---|
| PROCESS (ii) | Bi-3 | Bi-2 | Bi-1 | Bi | Bi+1 |

FOR RECEIVING

| PROCESS (iii) | Bi-2 | Bi-1 | Bi | Bi+1 | Bi+2 |
|---|---|---|---|---|---|
| PROCESS (iv) | Bi-3 | Bi-2 | Bi-1 | Bi | Bi+1 |

F I G. 14

INPUT DATA: | BLOCK SYNCHRO. | W1 | W2 | W3 | — — — — | WN | BLOCK SYNCHRO. |

ENCODED DATA: | BLOCK SYNCHRO. | S1 | S2 | S3 | — — | SN | V1 | V2 | V3 | — — — | VN | BLOCK SYNCHRO. |

F I G. 15

INPUT DATA: | BLOCK SYNCHRO. | W1 | W2 | W3 | — — — — | WN | BLOCK SYNCHRO. |

ENCODED DATA: | BLOCK SYNCHRO. | S1 | V1 | S2 | V2 | S3 | V3 | — — — | SN | VN | BLOCK SYNCHRO. |

DATA PROCESSING DEVICE

BACKGROUND OF THE INVENTION

1. Field of the Invention:

This invention relates to a data processing device and, more particularly, to a device for processing a data sequence consisting of data correlated with each other.

2. Description of the Prior Art:

In transmitting normal audio and video signals for recording, it is known that the transmitted amount of information can be reduced to a great extent by an encoding arrangement wherein only the varying portions of these signals are transmitted by utilizing the correlation of audio signals on the time base and the spatial correlation of the video signal. The so-called high efficiency encoding methods utilizing such correlation of signals include a method of carrying out differential pulse code modulation (hereinafter referred to as DPCM). However, with the DPCM method applied to data, the level distribution of the data becomes extremely biased. FIGS. 1(a) and 1(b) of the accompanying drawings show the biased level distribution resultrng from application of the DPCM method to data. When pulse code modulated (hereinafter referred to as PCM) data, which has a level distribution as shown in FIG. 1(a), is subjected to a DPCM process, the level distribution becomes as shown in FIG. 1(b). As shown, the level generating probability becomes high around a point 0. Thus, with the data DPCM processed and non-linearly quantized, the number of quantizing bits of the data can be decreased. However, in the event of transmission of data having steep level variations, reduction in the number of quantizing bits is hardly possible and thus the length of the transmission bits cannot be shortened. FIGS. 2(a) and 2(b) show the data level distribution obtained in transmitting a data sequence which is replete with steep level variations. FIG. 2(a) shows the level distribution of PCM processed data and FIG. 2(b) that of DPCM processed data. As shown, there is some likelihood that the data would be deteriorated to a great degree with the transmission bit length shortened by merely carrying out a DPCM process. In other words there, are two requirements. One is the reduction in the transmission bit length, while the other is securing a sufficient dynamic range. Encoding methods for meeting these two requirements include variable length encoding methods. Considering the encoding method of Huffman code to be exemplary of the conventional variable length encoding methods, that method has presented the following problems: FIGS. 3(a), 3(b), 4(a) and 4(b) illustrate the problem of the conventional variable length encoding method. FIG. 3(a) shows an encoding format and FIG. 3(b) shows a manner in which an error is propagated.

Referring to FIG. 3(b), even if only one bit is erroneously encoded, the error is propagated by decoding the code into a number of erroneous data bits. Once a code error is made, therefore, the data transmitted thereafter becomes completely meaningless. In addition to that, the bit length for each data is varying. Therefore, it is difficult to compose a data frame for carrying out error correction at a high degree of efficiency. Further, in an encodrng method which is arranged, for such high efficiency error correction, to make the bit length of each data only an integer times as much as a prescribed number of bits, it becomes necessary to have some connecting bit within each group consisting of the prescribed number of bits. This results in an increase in the transmission bit length. FIGS. 4(a) and 4(b) show an encoding method of this kind. FIG. 4(a) shows a variable encoding format and FIG. 4(b) shows a transmission format which has the bit length of each data arranged to be in integer times as much as three bits.

SUMAMRY OF THE INVENTION

It is an object of this invention to provide a data processing device which is capable of solving the above-stated problems of the prior art.

It is another object of this invention to provide a data processing device which is capable of attaining both the reduction in the length of transmission bit arrangement and mitigation of propagation of an error.

It is a further object of this invention to provide a data processing device which is capable of performing a variable length encoding process and is arranged to facilitate error correction.

It is a still further object of this invention to provide a data processing device which is capable of performing fine quantization and is arranged to permit reduction in the length of transmission bits.

To attain this object, a data processing device arranged, according to this invention to process a data sequence consisting of data having an m number (m: an integer) of quantization levels comprises: means for forming a fixed bit number part indicating a group to which the data belongs among an n number of level groups (n: an integer less than m) obtained by dividing the m number of quantization levels; and means for forming a variable bit number part indicating the levels of the data to an extent of unit quantization level within the level group.

These and further objects and features of this invention will become apparent from the following detailed description of embodiments thereof taken in conjunction with the accompanying drawings.

BRIEF DESCRIPTION OF THE DRAWINGS

FIGS. 3(a) and 3(b) are illustrations of error propagation resulting from a variable length encoding process.

FIGS. 4(a) and 4(b) are illustrations of an increased bit length resulting from framing performed on variable length encoded data.

FIG. 5 is a graph showing the data processing principle of this invention.

FIG. 13 is a timing chart showing the timing of a data block processing operation of the device of FIG. 6.

FIG. 14 is an illustration of the format of a data sequence to be transmitted.

FIG. 15 is an illustration of another example of the format of the data sequence to be transmitted.

DETAILED DESCRIPTION OF THE PREFERRED EMBODIMENTS

Figure 1A:
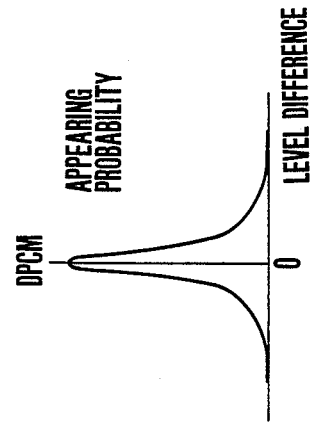
FIGS 1(a) and 1(b) are illustrations of biased level distribution resulting from a DPCM process performed on data.
Figure 2A:
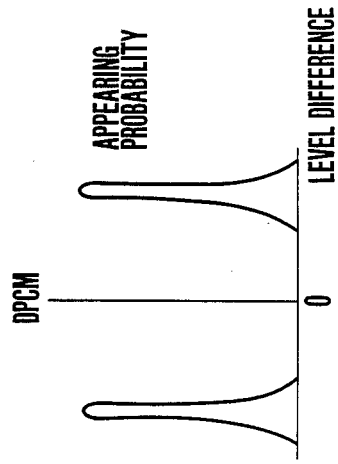
FIGS. 2(a) and 2(b) are illustrations of level distribution obtained by transmitting a data sequence which is replete with steep level variations.
Figure 1B:
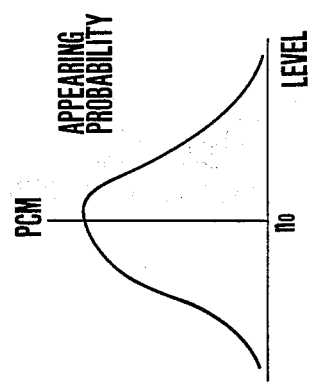
Figure 2B:
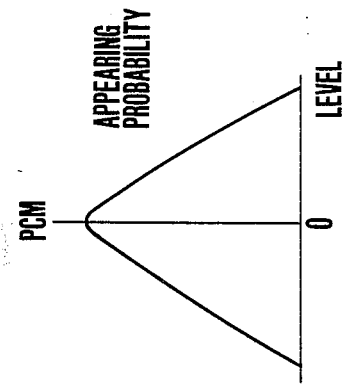

The data processing operation principle of this invention is as described below with reference to FIG. 5.

A data sequence is assumed to have the whole dynamic range thereof encoded with an M number of quantized levels. This data sequence is divided into N number of level regions ($n_0$ to $n_1$, $n_1$ to $n_2$, ... and $n_{N-1}$ to $n_N$) as shown in FIG. 5. The signal appearing probability for each level region is assumed to be equal to another. In other words, with the appearing probability of the signal of a level n assumed to be P(n), there obtains the following relation:

$$\int_{n_0}^{n_1} P(n)dn = \int_{n_1}^{n_2} P(n)dn = \ldots = \int_{n_{N-1}}^{n_N} P(n)dn \quad (1)$$

Each of the level regions ($n_{i-1}$, $n_i$) is then divided further into unit quantized levels. In other words, assuming that the number of the quantized levels in each level region is $n_i$, a total number of quantized levels is divided into $$M = \sum_{i=1}^{N} m_i .$$

As apparent from FIG. 5, the level range of the level region is wider than that of the level region 1. The subject encoding method is advantageous for transmission of such data that is obtained by digitizing a signal having a biased level appearing probability characteristic as shown in FIG. 5. Assuming that the level region i is divided into $2^{i-1} m_i$, it becomes $m_2 = 2m_1$, $m_3 = 2^2 m_1$, ... and $m_i = 2^{i-1} m_1$. Meanwhile, assuming that the probability of signal appearance in the level region i is $P_i$, it can be expressed as follows:

$$P_i = \int_{n_{i-1}}^{n_i} P(n)dn$$

In the case of N=8, $P_1 = P_2 = \ldots$ and $= P_8$ is derivable from Formula (1), and the following from the total appearance probability $$\sum_{i=1}^{8} P_i = 1:$$
$$P_1 = P_2 = \ldots = P_8 = \tfrac{1}{8}$$

If information that the encoded data belongs to the level region i is expressed in fixed bits, in the case of N=8, the number of bits $N_b$ necessary for designating the whole region becomes $N_b = 3(2^3 = 8)$. Now, with the number of quantizing bits in the region i set at $m_i = 2^{i-1} m_1$ as mentioned in the foregoing and with $m_1$ assumed to be $m_1 = 1$, the number of the quantizing bits in the region i becomes $m_i = 2^{i-1}$. In other words, when the region i is divided into fine level details, the number of bits $m_{bi}$ for designating the data down to a unit quantizing level within each level region becomes $m_{bi} = i - 1$. Accordingly, the number of bits (i−1) which is required for designating unit quantizing levels within each level region is a variable value dependent upon the value i. Therefore, the number of bits required for designating a desired unit quantizing level (i, j) is the sum ($N_b + m_{bi}$) of a fixed bit number $N_b$ and a variable bit number $m_{bi}$.

| Original input signal level region | $N_b$ | $m_{bi}$ | $N_b + m_{bi}$ |
|---|---|---|---|
| i = 1 | 3 | 0 | 3 |
| 2 | 3 | 1 | 4 |
| 3 | 3 | 2 | 5 |
| 4 | 3 | 3 | 6 |
| 5 | 3 | 4 | 7 |
| 6 | 3 | 5 | 8 |
| 7 | 3 | 6 | 9 |
| 8 | 3 | 7 | 10 |

On the assumption that the signal appearing probability in one level region is the same as that of another region, an average number of bits $\overline{W_b}$ necessary for designating the level of one data can be obtained as shown below:

$$\overline{W_b} = \sum_{i=1}^{8} (N_b + m_{bi}) P_i = \tfrac{1}{8}(3 + 4 + \ldots + 10) = 6.5 \text{ bits}$$

Then, it can be expressed as follows:

| Level region No. (N = 8) | Level | Bit number fixed part |
|---|---|---|
| i = 1 | 0 | 000 |
| 2 | 1-2 | 001 |
| 3 | 3-6 | 010 |
| 4 | 7-14 | 011 |
| 5 | 15-30 | 100 |
| 6 | 31-62 | 101 |
| 7 | 63-126 | 110 |
| 8 | 127-254 | 111 |

| Bit number variable part | Average signal appearing probability per level |
|---|---|
| 0 | $P_1$ |
| 1 | $1/2\ P_1$ |
| 2 | $1/4\ P_1$ |
| 3 | $1/8\ P_1$ |
| 4 | $1/16\ P_1$ |
| 5 | $1/32\ P_1$ |
| 6 | $1/64\ P_1$ |
| 7 | $1/128\ P_1$ |

Referring to the above table, if a level 255 is added to the level region i=8 and 255 is assumed to be equal to 254, the average number of bits $\overline{W_b}$ for one word becomes as follows:

$$\overline{W_b} = \tfrac{1}{8}(3 + 4 + \ldots + 9) + \left(10 \times \tfrac{1}{8} \times \tfrac{128 + 1}{128}\right) = 6.510$$

Therefore, compared with the case where the number of bits to be transmitted is fixed at 8 bits in encoding, the number of bits can be reduced to 81.4%. For the level region i=8, if one bit is added for the region to make the number of bits of the variable part thereof 8, the average number of bits $W_b$ then becomes:

$$\overline{W_b} = \frac{1}{8}(3 + 4 + \ldots + 9) +$$

$$\left(11 \times \frac{1}{8} \times \frac{128 + 1}{128}\right) = 6.636$$

In this instance, compared with the case where the number of bits is fixed at 8 bits for encoding, the number of transmission bits can be reduced to 82.9%. With encoding carried out in the above-stated manner, the code for each level becomes as shown below:

| Level | Fixed part (level region) | Variable part (level position within level region) |
|---|---|---|
| 0 | 000 | |
| 1 | 001 | 0 |
| 18 | 100 | 0011 |
| 125 | 110 | 111110 |
| 254,255 | 111 | 1111111 |

Figure 6:
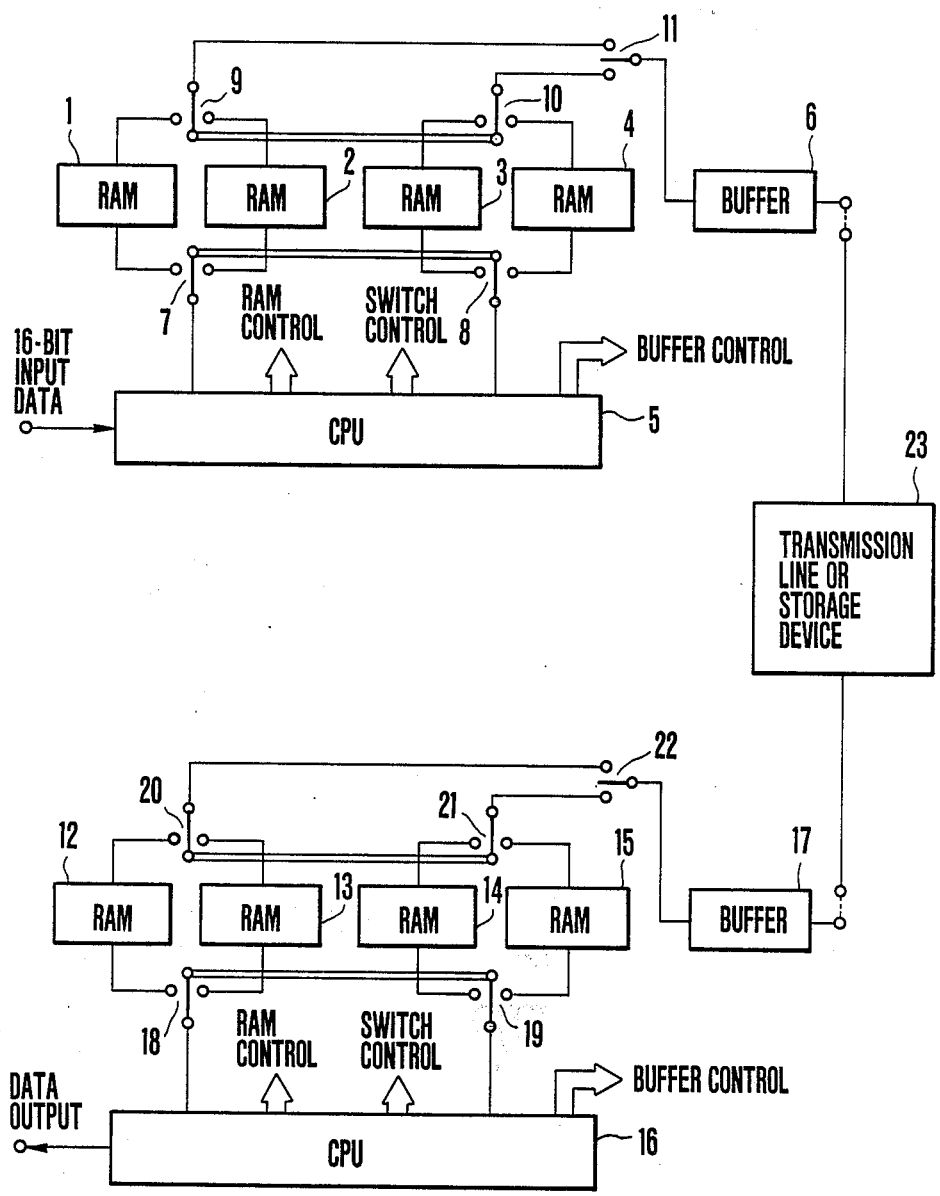
FIG. 6 is block diagram showing the arrangement of a data processing device embodying this invention as an embodiment thereof.

FIG. 6 is a block diagram showing a device arranged, according to this invention as an embodiment thereof, to perform a variable length encoding operation on a data sequence having a dynamic range of 65536 levels (16 bits in the case of the fixed bit number encoding method) in accordance with the variable length encoding method of this invention. Referring to FIG. 6, the device is provided with random access memories (RAM's) 1, 2, 3, 4, 12, 13, 14 and 15; central processing units (CPU's) 5 and 16; and buffers 6 and 17. In this specific embodiment, the number of bits of the fixed part is arranged to be 4 bits and that of the variable part to be from 0 to 15.

Data of 16 bits, arranged either in parallel or in series, are taken in one after another by the CPU 5. Each data thus received is then converted into a variable length code consisting of a fixed bit number part having 4 bits and a variable bit number part having 0 to 15 bits. The variable length code thus obtained is written into the RAM's 1 and 2 in a time sharing manner in quantity corresponding to a word number required for forming one data block with the fixed bit number part. After a memory area for number of bits of the variable bit number part, which is determined by the fixed bit number part, is secured, the variable bit number part, which has a variable bit number portion corresponding to the fixed bit number portion of the RAM 1, is written into the RAM 3 and likewise, a variable bit number portion thereof, corresponding to the fixed bit number portion of the RAM 2, is written into the RAM 4. Such being the arrangement, various error correcting methods, or an error preventing process such as a cross interleave process or the like, are applicable either during the process of taking in one data block portion of data or after completion of the taking in process. After that, these data are taken into the buffer 6 via switches 9, 10 and 11 for adjustment of transmission timing. Then, the data which are thus processed are transmitted in the form of serial data of 4 to 19 bits. The serial data of 4 to 19 bits are then received via a digital transmission line or a digital recording device 23. The serial data thus received are taken into the buffer 17 for timing adjustment. Then, under the control of the CPU 16 operating on the basis of a block synchronizing signal, the fixed bit number part of the data is written into RAM's 12 and 13 in a time sharing manner. A portion of the variable bit number part corresponding to the fixed bit number portion of the RAM 12, is written into the RAM 14 and a variable bit number portion corresponding to the fixed bit number portion of the RAM 13, into the RAM 15. Upon completion of taking in of the one block of the data, the variable length code of 4 to 19 bits is subjected to a data restoring process corresponding to the error correction or the error preventing process, as a cross interleave process, that is applied at the time of reproduction or transmission. The data are thus demodulated into the series or parallel data of 16 bits. The embodiment is arranged to perform each switching control operation at a timing on the basis of the block synchronizing signal.

Figure 7:
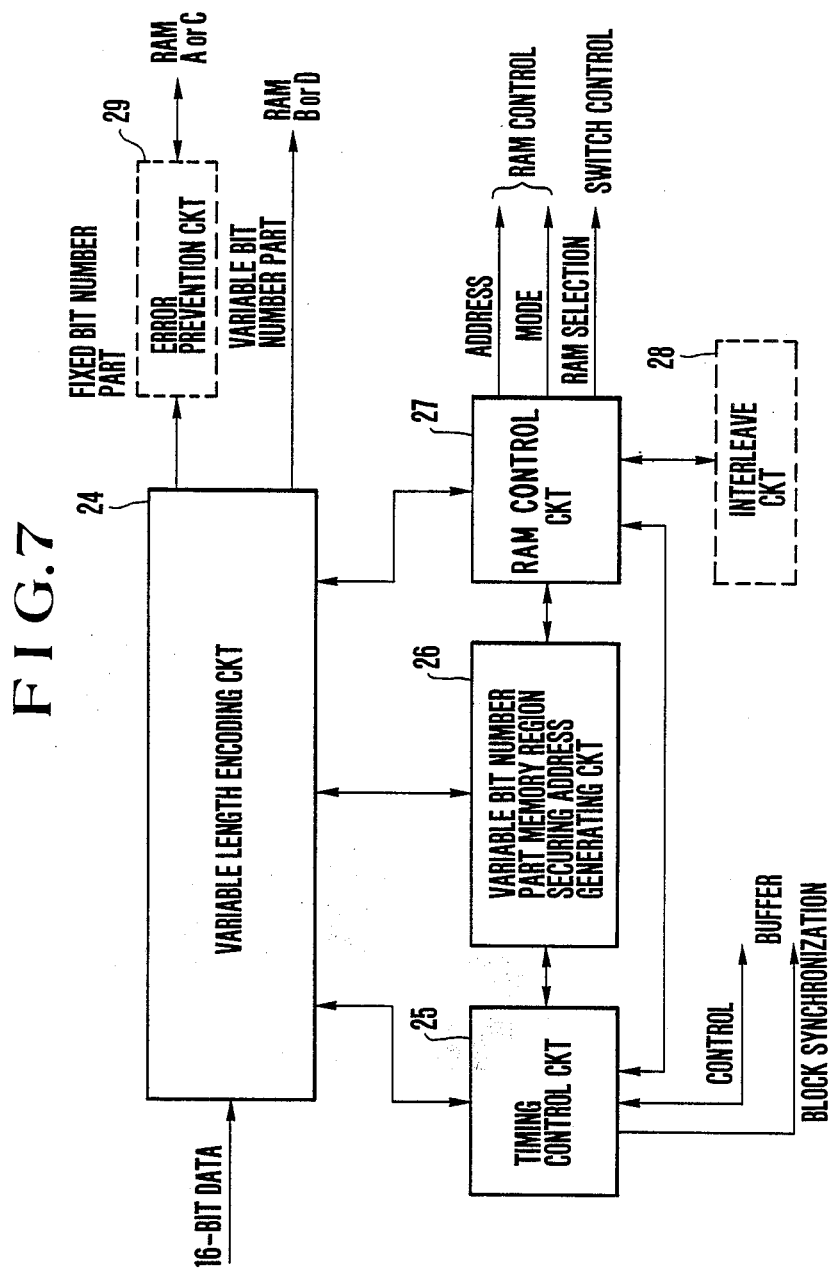
FIG. 7 is a block diagram showing, by way of example, the arrangement of a transmission CPU shown in FIG. 6.
Figure 8:
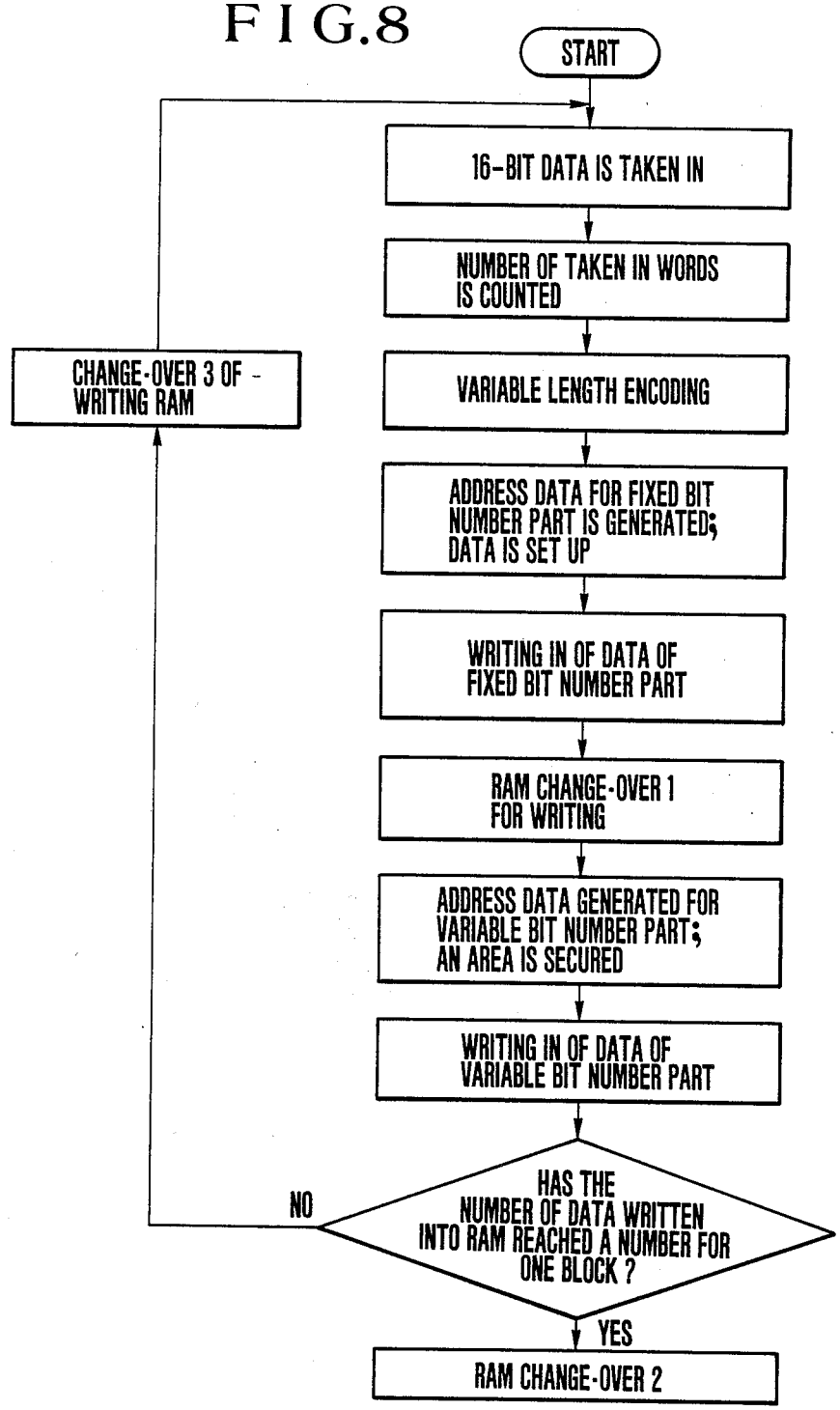
FIG. 8 is a flowchart showing a data writing operation on the RAM's of the CPU of FIG. 7.
Figure 9:
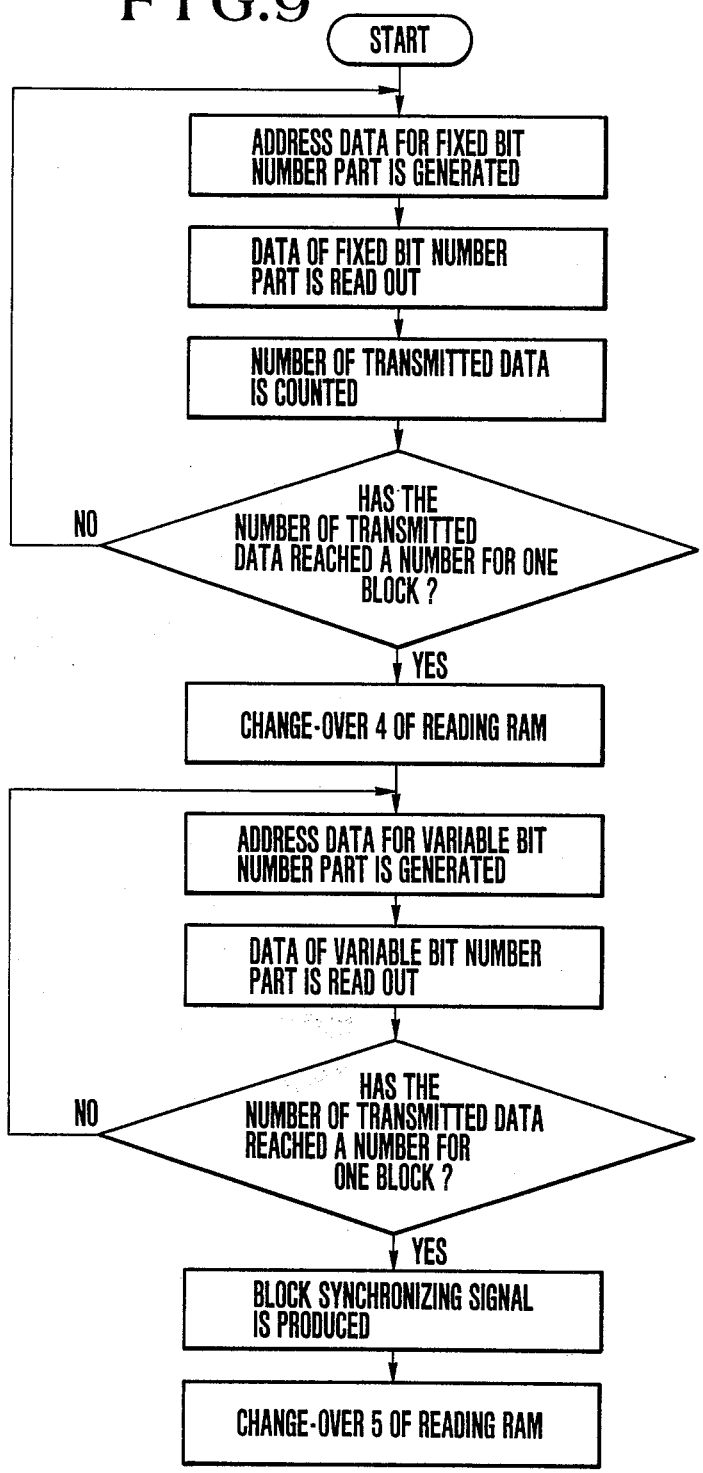
FIG. 9 is a flowchart showing a data reading operation on the RAM's of the CPU of FIG. 7.

FIG. 7 shows, by way of example, the arrangement of the CPU 5 for transmission. The CPU 5 mainly comprises a variable length encoding circuit 24 which is arranged to convert the incoming data of a fixed bit number into a variable length code consisting of a fixed bit number part and a variable bit number part; a timing control circuit 25 which is arranged to perform timing control over each action and count the number of data; a circuit 26 which is arranged to generate address data designating an address for a variable bit number portion determined by a fixed bit number portion of the variable length code generated by the variable length encoding circuit 24 and to secure a memory area by instructing a RAM control circuit 27 to set the memory area; and the RAM control circuit 27 which is arranged to designate a RAM address mode and to perform RAM switching. A pattern in which memory address designation is to be made is determined by an interleave circuit 28. A data block thus can be formed by interleaving the data of the fixed bit number portion. FIG. 8 is a flowchart showing by way of example, a data writing operation on the RAM's of the CPU 5 and the decoding operation thereof. FIG. 9 is another flowchart showing by way of example, the operation of the CPU 5 to be performed in sending out data from RAM's. The arrangement of the embodiment permits insertion of an error preventing instruction according to an error preventing method employed.

Figure 10:
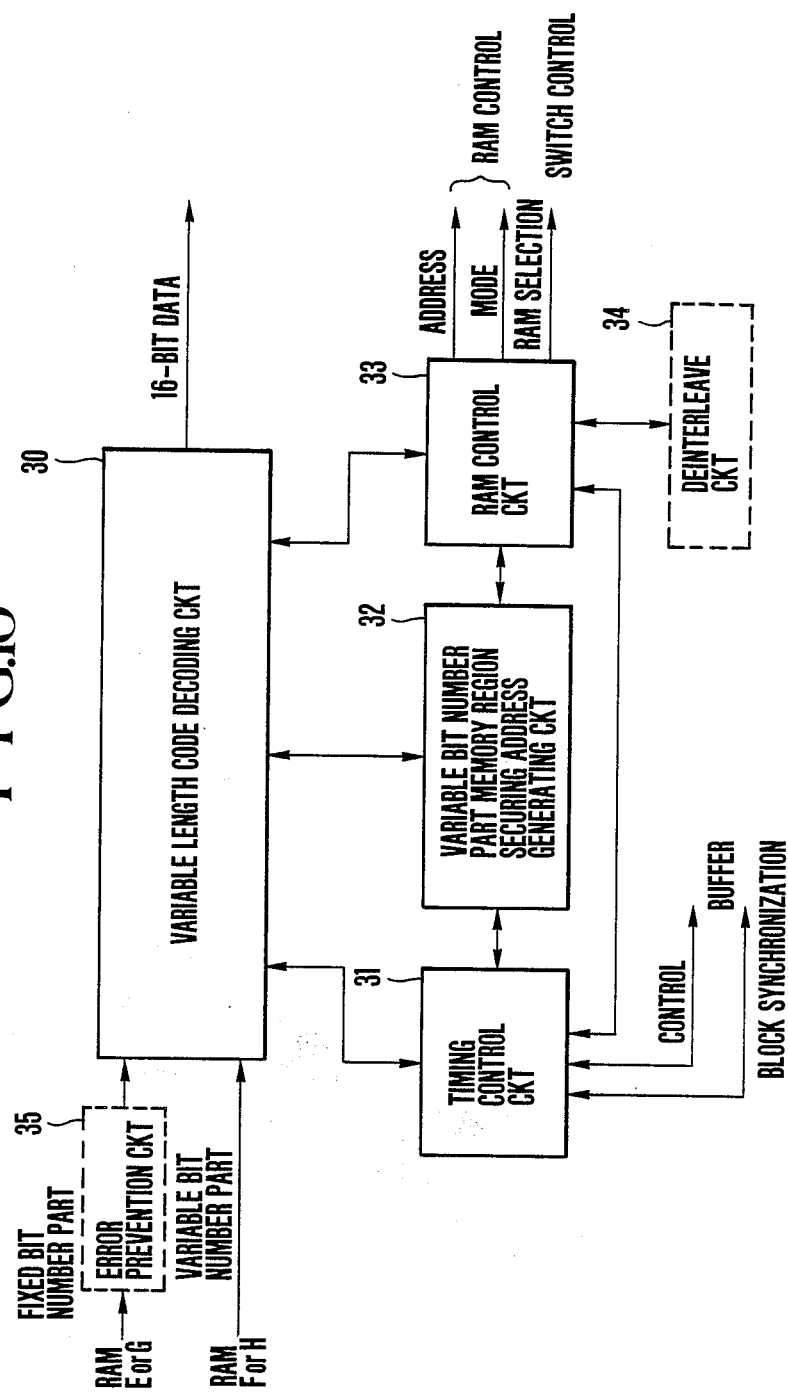
FIG. 10 is a block diagram showing, by way of example, the arrangement of a receiving CPU shown in FIG. 6.
Figure 11:
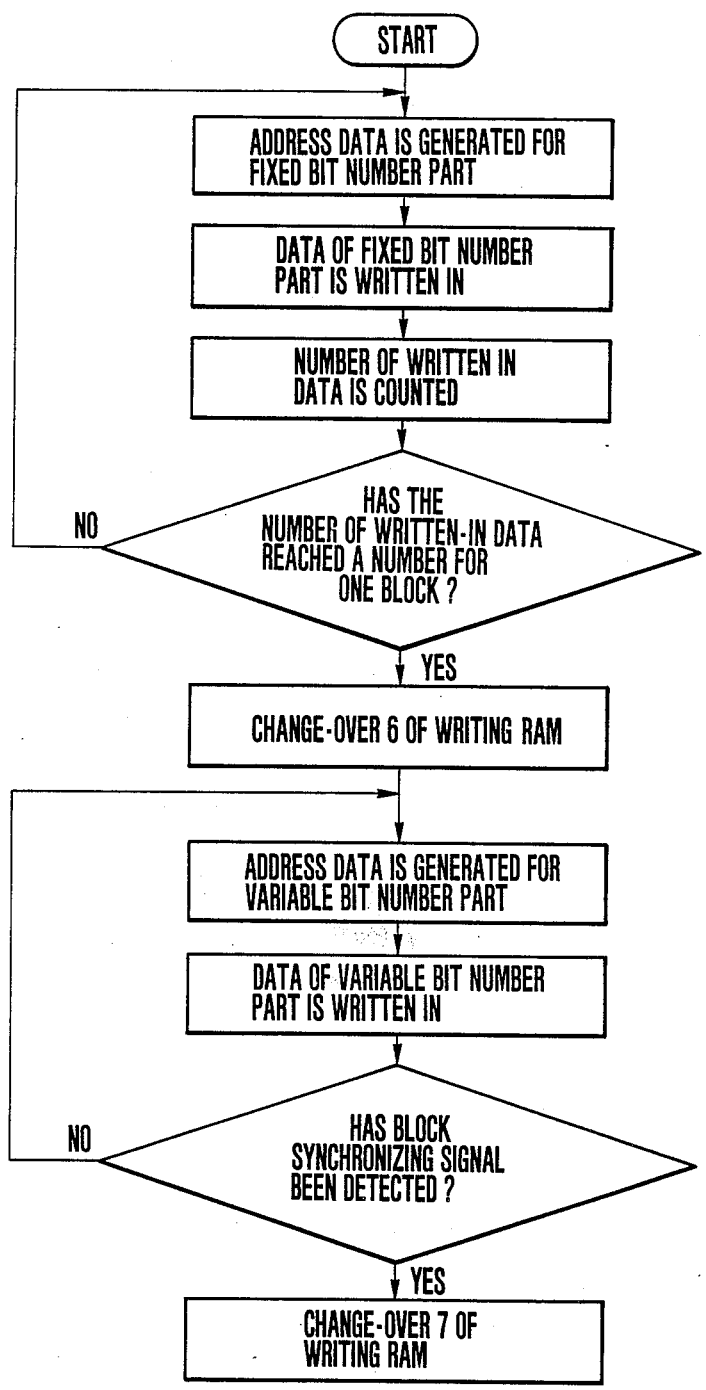
FIG. 11 is flowchart showing a data writing operation on the RAM's of the CPU of FIG. 10.
Figure 12:
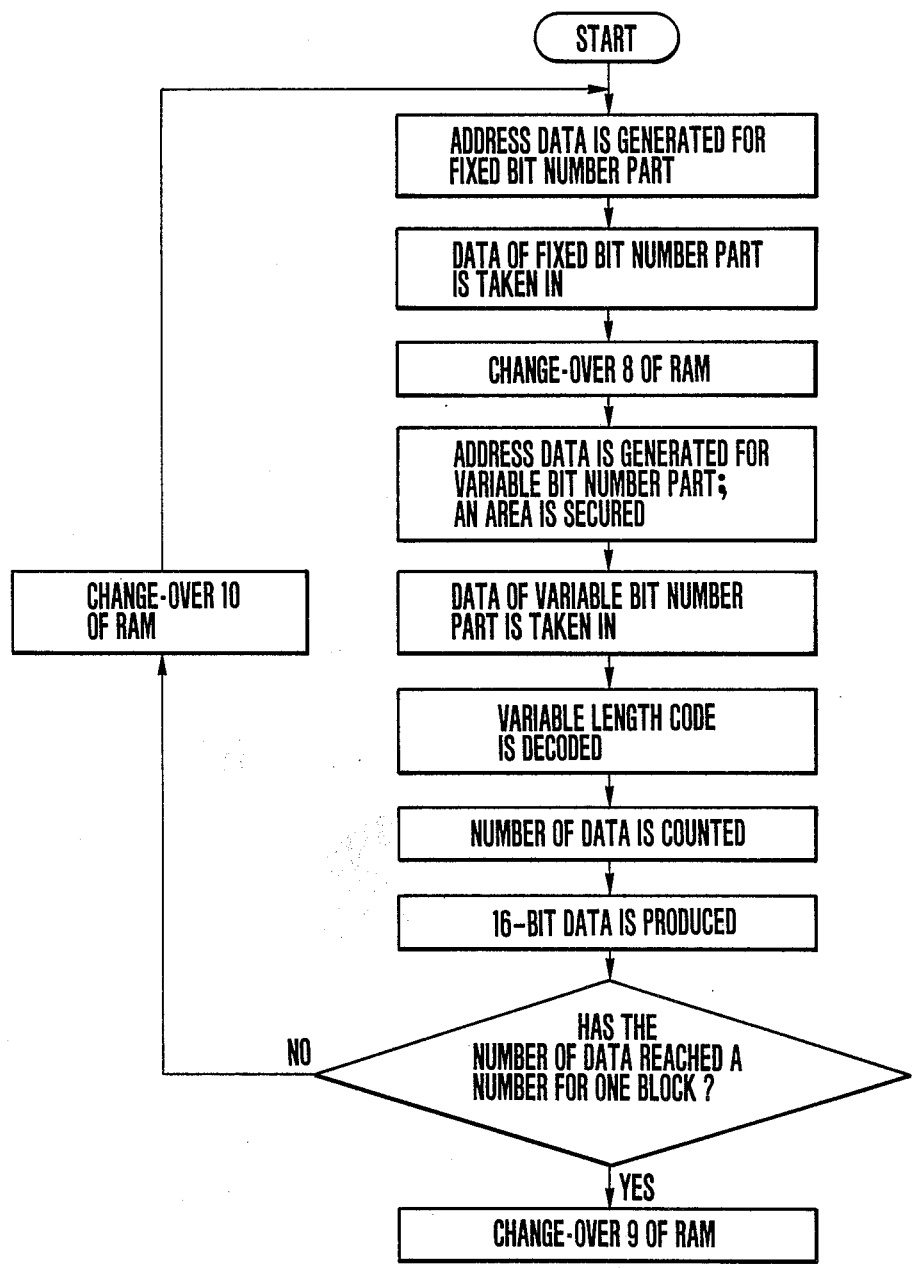
FIG. 12 is a flowchart showing a data reading operation on data from the RAM's of the CPU of FIG. 10.

FIG. 10 shows, by way of example, the arrangement of the CPU 16 for data receiving. The CPU 16 mainly comprises a decoding circuit 30 which is arranged to convert a variable length code into a data output of a fixed number of bits; a timing control circuit 31 which is arranged to perform timing control over each action and to count the number of data; an address data generating circuit 32 which is arranged to secure a memory or storage area for a variable bit number part and to generate address data for the variable bit number part; and a RAM control circuit 33. The CPU 16 is provided with a deinterleave circuit 34 or an error correction circuit 35 according to the condition of transmission. FIG. 11 is a flowchart showing by way of example, the operation of the CPU 16 performed in the decoding circuit to write data into the RAM's of the decoding circuit. FIG. 12 is another flowchart showing by way of example, the operation of the CPU 16 performed in the decoding circuit to read data from the RAM's. In case that an error preventing arrangement is provided for transmission, the CPU 16 must be provided with some means for error detection and giving an error correcting instruction corresponding to the error preventing arrangement.

Referring to FIG. 13, with one data block employed as unit of a time serial operation, the embodiment operates, for example, as described below:

In carrying out transmission, an incoming signal or data block Bi is variable length encoded in a real time manner. The converted data thus obtained is written into a RAM one after another. When the number of data written into one RAM reaches a number for forming one block, the RAM is changed over to another RAM. Then, another incoming signal Bi+1 is converted and written in that RAM. During the converting and writing operation on the signal or data Bi+1, the preceding data Bi is supplied to a buffer for transmission. Before transmission, it is of course possible to add some redundant code to the data for the purpose of error prevention. At the time of receiving, the transmitted data is processed (i) from a buffer to a RAM and (ii) from the RAM to an output terminal via a decoding process. These two actions are performed in parallel while the RAM's are being changed over from one RAM to another.

In the embodiment described, the transmission data is converted according to a format as shown in FIG. 14. This format is arranged with a data interleave process taken into consideration. In the event of a transmission system ensuring a sufficiently small error without such interleaving, the format of FIG. 14 may be replaced with a transmission data format which is arranged as shown in FIG. 15.

As mentioned in the foregoing, this invention excludes any redundant bit that does not represent the information on the input data at all. A data processing device according to this invention is, therefore, capable of performing data transmission at a higher degree of efficiency than the conventional device.

Further, the invented arrangement to encode only the fixed bit number part of the variable length code is virtually the same as an arrangement in which a data sequence is converted by non-linear quantization in transmitting data in a state of having a fixed bit number. The invention is, therefore, applicable to a case where a large dynamic range of such a signal or data sequence is hardly obtainable.

It is another advantage of the invention that the fixed bit number part obtained by the encoding method can be processed in exactly the same manner as the conventional code consisting of a fixed number of bits. Therefore, a data frame consisting of a given number of data can be readily formed to permit effective error preventing arrangements of varied kinds. Further, the restored data is stably obtainable from the fixed bit number part. Therefore, even if some error arises in the variable bit number part, the invention assures that the restored data still can be obtained in a somewhat effective state.

What is claimed is:

1. An encoding device for encoding an information signal, comprising:
   (a) means for forming first data consisting of a fixed number of bits which are obtained by coarsely quantizing levels of said information signal;
   (b) means for forming second data consisting of a variable number of bits including data obtained by more finely quantizing the levels of said information signal than in forming said first data; and
   (c) means for outputting said first data and said second data in a time sharing manner.

2. A device according to claim 1, wherein the data generating probability of each code assumable by said first data is equal to that of another.

3. A device according to claim 2, wherein in case that the first data consists of X bits where X is an integer, the data generating probability of each code is $\frac{1}{2}^X$.

4. A device for processing a data sequence consisting of data representing levels of an information signal, comprising:
   (a) first memory means for storing a first data sequence consisting of first data obtained by coarsely quantizing the levels of said information signal;
   (b) second memory means for storing a second data sequence consisting of second data which include data obtained by more finely quantizing the levels of said information signal than in said first data; and
   (c) means for adding an error correcting code only to data to be written into said first memory means.

5. A device for processing a data sequence consisting of data representing the levels of an information signal, comprising:
   (a) first memory means for storing a first data sequence consisting of first data obtained by coarsely quantizing the levels of said information signal;
   (b) second memory means for storing a second data sequence consisting of second data which include data obtained by more finely quantizing the levels of said information signal that in said first data; and
   (c) control means acting solely on said first memory means, said control means being arranged to cause the sequence in which the data of said first data sequence are written in and the sequence in which said data are read out to become different from each other.

6. A data processing device, comprising:
   (a) input means for inputting data indicating one of m number of quantization levels, where m is an integer;
   (b) first means for forming a fixed bit number code indicating one of n number of quantization level groups, where n is an integer less than m, to which a quantization level indicated by the input data belongs, said m number of quantization level being classified by said predetermined n number of quantization level groups; and
   (c) second means for forming a variable bit number code indicating a quantization level among the quantization level group indicated by the fixed bit number code according to the inputted data.

7. A device according to claim 6, further comprising output means for serially outputting said fixed bit number code and said variable bit number code.

8. A device according to claim 7, wherein said output means includes first memory means for storing said fixed bit number code and second memory means for storing said variable bit number code.

9. A device according to claim 8, wherein said output means further includes means for adding an error correction code to data to be written into said first memory means.

10. A device according to claim 8, wherein said output means further includes means for changing the sequence in which said fixed bit number code is read out from said first memory means from the sequence in which said fixed bit number code is written in said first memory means.

11. A device according to claim 5, wherein the number of bits of said variable bit number code is equal to that of corresponding data indicating a quantization level belonging to the same level group.

12. A device according to claim 6, wherein the generating probability of data indicating said m number of quantization levels is biased.

13. A device according to claim 12, wherein said n number of quantization level groups includes a first quantization level group consisting of an x number of quantization levels, where x is an integer, and a second quantization level group consisting of a y number of quantization levels, where y is an integer less than x.

14. A device according to claim 13, wherein the generating probability of data indicating the quantization level belonging to said n number of quantization level groups is approximately 1/n.

* * * * *